United States Patent [19]
Kamiyama et al.

[11] Patent Number: 5,597,744
[45] Date of Patent: Jan. 28, 1997

[54] METHOD OF PRODUCING A SILICON CARBIDE SEMICONDUCTOR DEVICE

[75] Inventors: Eiji Kamiyama; Kazuhiro Fusegawa; Nosho Toyama, all of Saitama-ken, Japan

[73] Assignees: Mitsubishi Materials Corporation, Tokyo; Research Institute of Innovative Technology for the Earth, Kyoto, both of Japan

[21] Appl. No.: 516,298

[22] Filed: Aug. 17, 1995

Related U.S. Application Data

[62] Division of Ser. No. 448,130, May 23, 1995.

[30] Foreign Application Priority Data

Jun. 7, 1994 [JP] Japan .................................. 6-150425

[51] Int. Cl.[6] ................................................ H01L 21/265
[52] U.S. Cl. .............................. 437/40; 437/41; 437/100; 437/190; 437/192; 148/DIG. 148
[58] Field of Search .......................... 437/40 GS, 41 GS, 437/41 SM, 180, 189, 190, 192; 148/DIG. 148

[56] References Cited

U.S. PATENT DOCUMENTS

| | | | |
|---|---|---|---|
| 4,762,806 | 8/1988 | Suzuki et al. | 437/100 |
| 5,196,360 | 3/1993 | Doan et al. | 437/41 SM |
| 5,270,534 | 12/1993 | Palmour | 437/100 |
| 5,385,855 | 1/1995 | Brown et al. | 148/DIG. 148 |
| 5,459,107 | 10/1995 | Palmour | 437/100 |

*Primary Examiner*—Tuan H. Nguyen
*Attorney, Agent, or Firm*—McAulay Fisher Nissen Goldberg & Kiel, LLP

[57] ABSTRACT

Electrodes 16a and 16b composed of metal nitride made of either one of TiN, ZrN, HfN, VN and TaN are formed on an N-type source region 12 and drain region 13 of a P-type SiC substrate 11, respectively, Nitrogen-rich layers 12a and 13a are formed in surface layer portions of the regions 12 and 13 which the electrodes composed of metal nitride 16a and 16b contact respectively. The nitrogen-rich layer allows the contact resistivity of the electrode to be made small, A metal nitride composed of either one of TiN, ZrN, HfN, VN and TaN is interposed between a gate electrode 15 of Mo and an interconnection of Al 17c to prevent the reaction of the gate electrode and the interconnection.

3 Claims, 9 Drawing Sheets

10 silicon carbide semiconductor device
11 SiC substrate
12 source region
13 drain region
12a, 13a nitrogen−rich layer
14a, 14b insulating film
15 gate electrode
16c TiN$_x$ layer (metal nitride layer)
16a source electrode
16b drain electrode
17a, 17b, 17c interconnections

FIG.1

10 silicon carbide semiconductor device
11 SiC substrate
12 source region
13 drain region
12a, 13a nitrogen-rich layer
14a, 14b insulating film
15 gate electrode
16c $TiN_x$ layer (metal nitride layer)
16a source electrode
16b drain electrode
17a, 17b, 17c interconnections

FIG.7 B 20 silicon carbide semiconductor device
21 SiC substrate
22 source region
23 drain region
22a, 23a nitrogen-rich layer
25 gate electrode
26c $TiN_x$ layer (metal nitride layer)
26a source electrode
26b drain electrode
27a, 27b, 27c interconnections

FIG. 8

METHOD OF PRODUCING A SILICON CARBIDE SEMICONDUCTOR DEVICE

This is a division of application Ser. No. 08/448,130, filed May 23, 1995.

BACKGROUND OF THE INVENTION

The present invention relates to a silicon carbide semiconductor device such as a metal oxide semiconductor field effect transistor (MOSFET), a metal semiconductor field effect transistor (MESFET), a bipolar transistor, and a vertical type of MOS transistor using a silicon carbide substrate and a method of producing the same. More particularly, the present invention relates to a silicon carbide semiconductor device using a metal nitride as a contact electrode and a method of producing the same.

A silicon carbide (SiC) semiconductor has a wide forbidden band (2.2 to 3.3 eV) compared to other semiconductors such as silicon (Si) and gallium arsenide (GaAs) which are widely used in practice. Also, the silicon carbide semiconductor is stable in thermal, chemical and mechanical property and has superior resistance of a radiation ray. Therefore, a semiconductor device using silicon carbide can be used as a device having high reliability and stability under severe condition of high temperature, high power and the radiation ray under which a semiconductor device composed of other material cannot be used. Specifically, application to a light emitting device emitting blue light which is in conjunction with the wide forbidden band enters the stage of practical use.

However, application of silicon carbide to electronic devices is not sufficient compared to the application to the light emitting device. One of the reasons is that there are not yet developed an electrode material suitable for a complicated electronic device producing process and having electrically good ohmic contact and the forming method of the electrode.

In research, it is tungsten (W), titanium (Ti), nickel (Ni) and silicide of these metals that is researched as electrode material for forming ohmic contact with the N-type silicon carbide semiconductor. The resistivities of these contacts are about $10^{-1}$ to $10^{-4}$ ohm.cm$^2$. These values are greatly different from those practically used in the Si and GaAs (about $10^{-6}$ ohm.cm$^2$).

W, Ti and silicide thereof are degraded in contact characteristic if heat treatment is performed at a low temperature. Therefore, heat treatment of a high temperature of 1100° C. or above is required to obtain a low contact resistivity even in a case of Ni which is said to have low contact resistivity. In this manner, the above materials are not suitable for electrode material. Also, TiN is disclosed as electrode material having ohmic contact to N-type silicon carbide which does not require high temperature heat treatment (R. C. Glass et al., "Low energy ion-assisted deposition of titanium nitride ohmic contacts on alpha (6 H)—silicon carbide", (Appl. Phys,. Lett 59 (22), pp. 2868–2870 (1991)). According to this paper, the growth of TiN film is performed by a vapor deposition method of Ti in which nitrogen ions are assisted by an ion gun.

On the other hand, a MOSFET is disclosed in, for example, Unexamined Published Japanese Patent Application 60-142568 as a conventional semiconductor device using silicon carbide substrate. In the semiconductor device, after source/drain regions are formed in a P-type silicon carbide single crystal substrate, a Ni layer is formed on the source/drain regions as ohmic contacts electrode and an aluminium (Al) layer is used for a gate electrode. Metal wirings are connected to these electrodes. Also, platinum (Pt), gold (Au), and aluminium (Al) are used for the gate electrode in a conventional MESFET device.

However, in a TiN electrode which is formed by nitrogen ion assisted vapor deposition of Ti, there is a problem in that a contact resistivity cannot be reduced because nitrogen is not introduced in a surface layer portion of a SiC region having a predetermined thickness, the portion contacting the TiN electrode, or nitrogen is not electrically activated even if the nitrogen is introduced. In order to solve the problem, a method is interested in which nitrogen as an N-type dopant to silicon carbide is introduced in the SiC region to electrically activate the N-type carriers. For this purpose, heat treatment is performed after the nitrogen ion implantation. In this method, however, it is difficult to introduce nitrogen ions only into the surface layer portion of SiC region with a high concentration and therefore there is a problem in that it is not easy to form a fine contact.

Otherwise, in a semiconductor device disclosed in Unexamined Published Japanese Patent Application 60-142568 there are the following problems. That is, first, if Ni is used as an ohmic contact electrode material in the source/drain region, the contact resistivity is still greater than that of semiconductor device of Si and GaAs, as described above. Second, in a case that Al is used for the gate electrode material, Al is melt because of a high temperature heat treatment. Therefore, a refractory metal such as molybdenum (Mo) and tungsten (W) needs to be used in actual. When such a refractory metal is used, the metal reacts with Al or tungsten silicide (WSi$_x$) of the interconnection formed on the metal, which results in troubles such as generation of an irregular portion and holes, and peeling of the gate electrode due to the reaction resultant product.

The inventors found out that the contact resistivity can be reduced when a metal nitride comprising either one of titanium nitride (TiN), zirconium nitride (ZrN), hafnium nitride (HfN), Vanadium nitride (VN) and tantalum nitride (TaN) is used as the electrode material of SiC region and a nitrogen-rich layer is formed on the surface layer portion of the SiC region on which the metal nitride layer is to be formed. Also, the inventors found out that it can be prevented for the gate electrode material to react with the interconnection by interposing the metal nitride layer between the gate electrode and the interconnection composed of material such as Mo and the WSi$_x$.

SUMMARY OF THE INVENTION

An object of the present invention is to provide a silicon carbide semiconductor device with an electrode having a small contact resistivity.

Another object of the present invention is to provide a silicon carbide semiconductor device in which a gate electrode material can be prevented from reacting with an interconnection.

Still another object of the present invention is to provide a method of producing these silicon carbide semiconductor devices.

Figure 1:
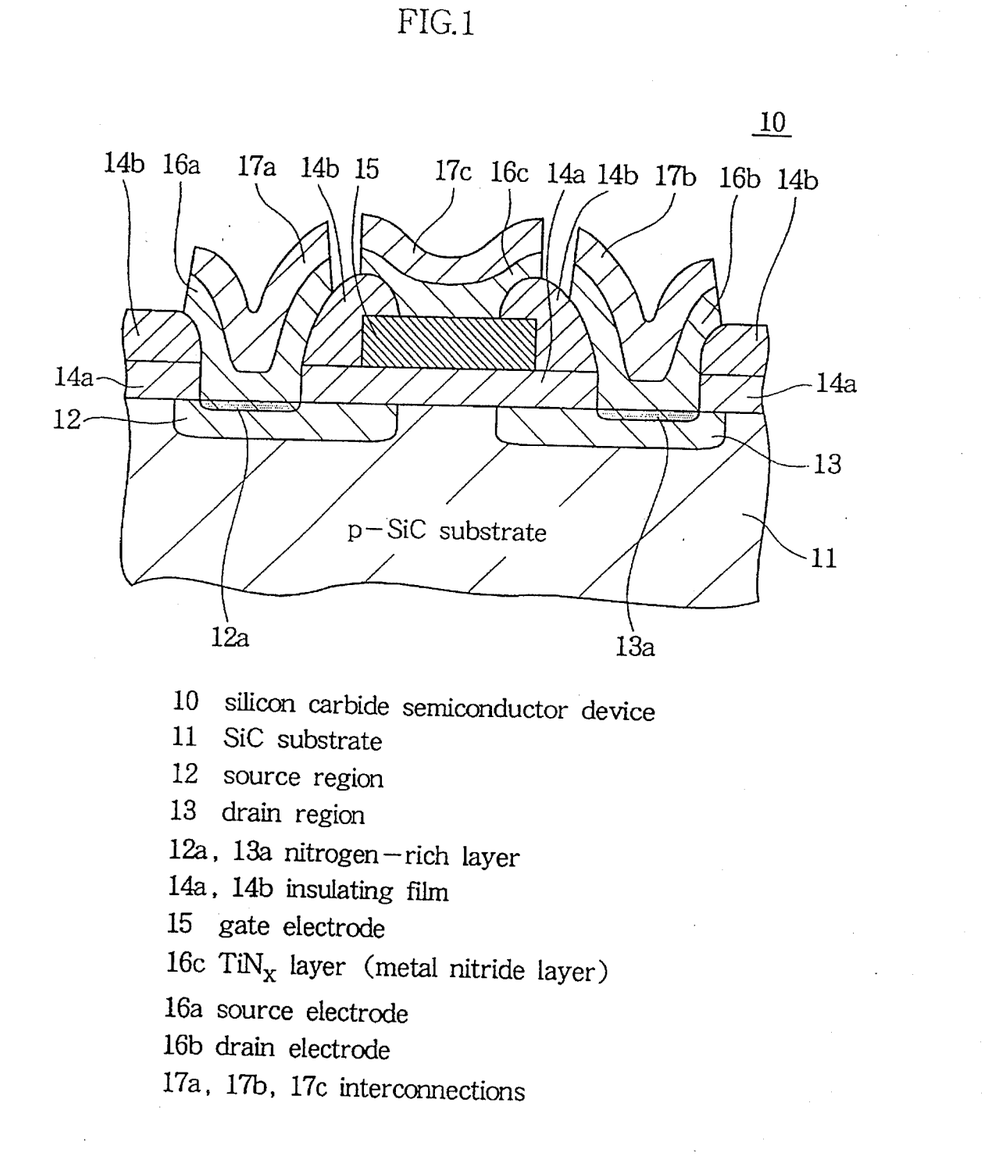
FIG. 1 is a cross section schematically showing the structure of a SiC-MOSFET according to a first embodiment of the present invention.
Figure 7A:
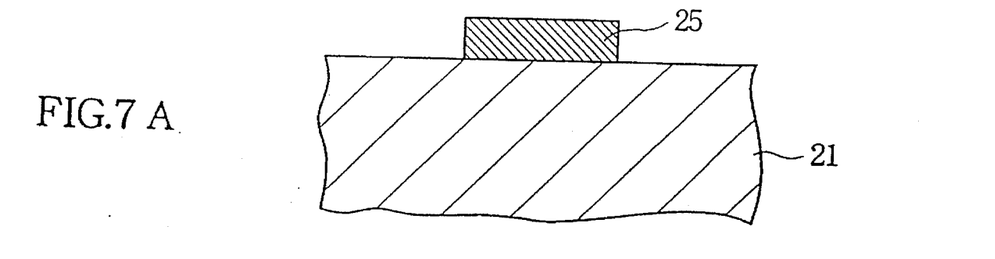
FIG. 7 is a cross section for explaining the producing method of a SiC-MESFET according to a fifth embodiment of the present invention.
Figure 7B:
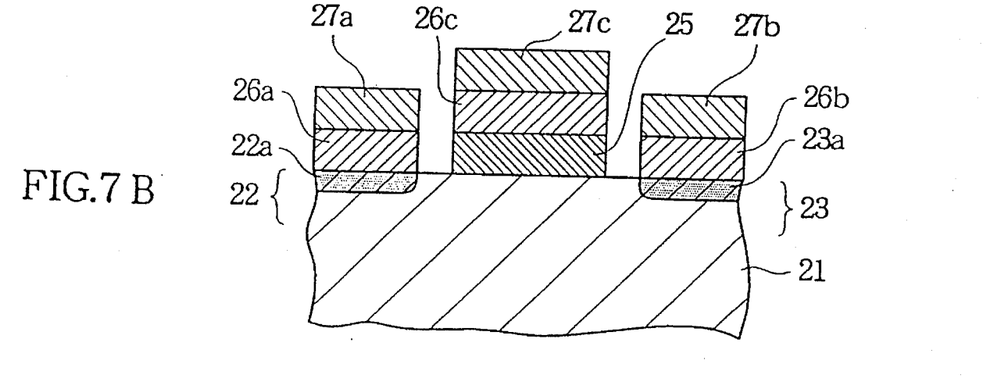

As shown in FIGS. 1 and 7(B), the invention according to claim 1 is a silicon carbide semiconductor device comprising an N-type SiC regions 12 and 13 or N-type silicon carbide substrate 21, an electrode 16a and 16b or 26a and 26b composed of metal nitride made of either one of TiN, ZrN, HfN, VN and TaN and formed on said N-type SiC regions 12 and 13 or N-type silicon carbide substrate 21, and nitrogen-rich layers 12a and 13a or 22a and 23a formed in a surface layer portion of the SiC regions 12 and 13 or silicon carbide substrate 21 which said electrodes 16a and 16b or 28a and 26b contacts.

Either α-SiC or β-SiC may be used as the N-type silicon carbide substrate 21 or the P-type silicon carbide substrate 11 in which the N-type silicon carbide regions 12 and 13 are formed.

As shown in FIG. 1, in the invention according to claim 2, a silicon carbide semiconductor device in which a gate electrode 15 composed of a refractory metal or polysilicon is provided above a P-type silicon carbide substrate 11 via an insulating film 14a, includes a metal nitride layer 16c composed of either one of TiN, ZrN, HfN, VN and TaN and interposed between said gate electrode 15 and an interconnection 17c connected to said gate electrode 15. The gate electrode 15 according to claim 2 is composed of a refractory metal such as Mo, W and silicide of these metal or polysilicon and the interconnection 17c is composed of Al or $WSi_x$.

As shown in FIG. 7(B), in the invention according to claim 3, a silicon carbide semiconductor device in which a gate electrode 25 is provided on an N-type silicon carbide substrate 21 includes a metal nitride layer 26c composed of either one of TiN, ZrN, HfN, VN and TaN and interposed between said gate electrode 25 and an interconnection 27c connected to said gate electrode. The semiconductor device is applied to, for example, a SiC-MESFET. The gate electrode 25 according to claim 3 is composed of Au, Pt or Al and the interconnection 27c is composed of Al or $WSi_x$.

As shown in FIG. 1, the invention according to claim 4, in a silicon carbide semiconductor device comprising a P-type silicon carbide substrate 11, a gate electrode 15 provided above said silicon carbide substrate 11 via an insulating film 14a, N-type source/drain SiC regions 12 and 13 formed on said silicon carbide substrate 11, and electrodes 16a and 16b composed of metal nitride made of either one of TiN, ZrN, HfN, VN and TaN and formed on said SiC regions 12 and 13, is characterized in that the silicon carbide semiconductor device includes a metal nitride layer 16c composed of either one of TiN. ZrN, HfN, VN and TaN and interposed between said gate electrode 15 and an interconnection 17c connected to said gate electrode 15, and a nitrogen-rich layer 12a and 13a formed in surface layer portions of the SiC regions 12 and 13 which said electrodes 16a and 16b composed of said metal nitride contact.

The invention according to claim 5, in the invention according to claim 4, is a silicon carbide semiconductor device which said gate electrode 15 comprises a refractory metal or polysilicon, said N-type source/drain SiC regions 12 and 13 are formed on said P-type silicon carbide substrate 11 on the both sides of said gate electrode 15, and said electrode 16a and 16b composed of a metal nitride comprising either one of TiN, ZrN, HfN, VN and TaN is formed on said N-type SiC regions 12 and 13. The semiconductor device is applied to a SiC-MOSFET, for example.

As shown in FIG. 7(B), the invention according to claim 6 is characterized in that in a silicon carbide semiconductor device comprising an N-type silicon carbide substrate 21, a gate electrode 25 comprising Au, Pt or Al and provided directly on said silicon carbide substrate 21, N-type source/drain SiC regions 22 and 23 formed on said silicon carbide substrate 21, and electrodes 26a and 26b composed of metal nitride comprising either one of TiN, ZrN, HfN, VN and TaN and formed on said SiC regions 22 and 23, said silicon carbide semiconductor device includes a metal nitride layer 26c composed of either one of TiN, ZrN, HfN, VN and TaN and interposed between said gate electrode 25 and an interconnection 27c connected to said gate electrode 25, and nitrogen-rich layers 22a and 23a formed in a surface layer portion of the SiC regions 22 and 23 with which said electrodes 26a and 26b composed of said metal nitride are respectively contact.

As shown in FIG. 1 or 7(B), the invention according to claim 7 or 8, in the invention according to claim 1, 4 or 6, includes said nitrogen-rich layers 12a and 13a or 22a and 23a having a thickness from 5 Å to 500 Å and containing a nitrogen density of at least $1 \times 10^{19}/cm^3$. Desirably, said nitrogen-rich layers 12a and 13a or 22a and 23a have a thickness from 20 Å to 500 Å and contain a nitrogen density of at least $1 \times 10^{20}/cm^3$.

As shown in FIGS. 2(A) to 2(I), the invention according to claim 9 is a method of producing a silicon carbide semiconductor device, comprising the steps of forming N-type source/drain SiC regions 12 and 13 on a P-type silicon carbide substrate 11, forming an insulting film 14a on said silicon carbide substrate 11 between said source/drain SiC regions 12 and 13, forming a gate electrode 15 on said insulating film 14a, formimg on said gate electrode 15 and said source/drain SiC regions 12 and 13 metal nitride layers 16c, 16a and 16b composed of either one of TiN, ZrN, HfN, VN and TaN, and forming interconnections 17c, 17a and 17b on said metal nitride layers 16c, 16a and 16b.

The invention according to claim 10, in the invention according to claim 9, is a method of producing a silicon carbide semiconductor device in which when said metal nitride layers 16a and 16b are formed, the nitrogen-rich layers 12a and 13a are formed on the surface layer portion of said source/drain SiC regions 12 and 13, and the invention according to claim 11 is a method of producing a silicon carbide semiconductor device according to claim 9, in which said metal nitride layers 16c, 16a and 16b are formed in a nitrogen ambient by a sputtering method using a metal target composed of either one of Ti, Zr, Hf, V and Ta or a metal nitride target composed of either one of TiN, ZrN, HfN, VN and TaN.

According to the invention defined in claims 1 and 10, the nitrogen-rich layers 12a and 13a or 22a and 23a are formed in the surface layer portions of the silicon carbide regions and the silicon carbide substrate and the nitrogen acts as dopant so that the contact resistivity of source/drain electrodes 16a and 16b or 26a and 26b can be reduced. These electrodes function as desirable ohmic contacts electrodes in the SiC semiconductor device.

According to the invention defined in claims 2 and 3, the metal nitride layer 16c or 28c are interposed between the gate electrode 15 or 25 and the interconnection 17c or 27c and the metal nitride layer 16c or 26c functions as a barrier metal layer so that the reaction between the gate electrode 15 or 25 and the interconnection 17c or 27c can be prevented even in a heat treatment at a high temperature. Thereby, there is no problem in that trouble such as peeling and irregularity is caused on the gate electrode 15 or 25. For instance, the metal nitride layer functions as a reaction preventing layer between the refractory metal or polysilicon and the interconnection. Also, the metal nitride layer functions as a diffusion barrier preventing impurity (P, B, As, etc.) doped in the polysilicon from outdiffusion in the heat treatment at a high temperature.

According to the invention defined in claim 4, 5 or 6, the contact resistivity of the electrodes 16a and 16b or 26a and 26b can be reduced by the nitrogen-rich layers 12a and 13a or 22a and 23a and trouble such as peeling of the gate electrode 15 or 25 can be completely eliminated by interposing the metal nitride layer 16c or 26c.

According to the invention defined in claim 9, the SiC semiconductor device can be manufactured with the less number of steps which device has a small contact resistivity, has the electrodes 16a and 16b stable such that the electrodes do not react with the SiC in the heat treatment in the producing steps, and has no trouble of peeling the gate electrode 15.

According to the invention defined in claim 11, the nitrogen-rich layer 12a or 13a can contain nitrogen to a high concentration.

Note that if the silicon carbide substrate is located in a high temperature ambient of 100° to 800° C., desirably 200° to 400° C., other than the silicon carbide substrate is located in the nitrogen plasma ambient on the sputtering, the surface layer portion is activated so that the nitrogen-rich layer can further increase the content of nitrogen to a high concentration. After the nitrogen-rich layer is formed, if the sputtering is further continued, the metal nitride layer is selectively formed in the nitrogen-rich layer so that the source electrode and drain electrode can be formed. The interface between the electrode composed of metal nitride and a region composed of the silicon carbide is not damaged even in a high temperature ambient of about 900° C. due to the barrier behavior which the metal nitride has and the surface layer portion is also held. As a result, the electrical characteristics of electrode composed of metal nitride is not degraded even in the high temperature ambient. Further, a special heat treatment is not necessary after the sputtering because the contact resistivity is small even in a so-called "as deposited" state, i,e., a state in which the electrode is not subjected to any heat treatment after the sputtering.

DESCRIPTION OF THE PREFERRED EMBODIMENTS

The present invention will be described with reference to the accompanying drawings.

<EMBODIMENT 1>

Figure 2:
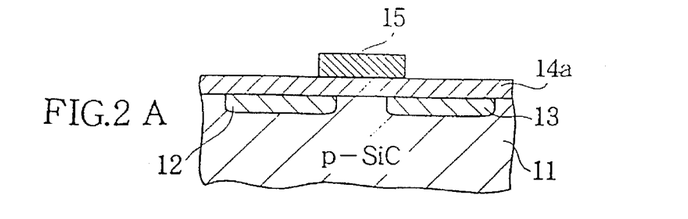
FIG. 2 is a cross section for explaining the producing steps of the SiC-MOSFET.

As shown in FIGS. 1 and 2, a silicon carbide semiconductor device 10 of a SiC-MOSFET type will be described in this embodiment.

First, as shown in FIG. 2(A), an N-type source region 12 and an N-type drain region 13 are formed on a P-type SiC (to be referred to as "P-SiC") substrate 11 with a predetermined distance apart from each other by an ion implantation method. An insulating film 14a composed of $SiO_2$ is formed on the SiC substrate 11 by performing thermal oxidation to this SiC substrate 11. Then, a Mo film is deposited as a gate electrode 15 on the insulating film 14a in the embodiment. Next, as shown in FIG. 2(B), an insulating film 14b composed of $SiO_2$ is formed on the insulating film 14a and the gate electrode 15 by a chemical vapor deposition (CVD) method. Then, as shown in FIG. 2(C), a photoresist layer 14c is formed on the insulating film 14b with a predetermined pattern. As shown in FIG. 2(D), a part of the insulating films 14a and 14b which is not covered by the photoresist layer 14c is removed by etching by use of etchant of a hydrofluoric acid group. In this manner, source/drain regions 12 and 13 and the gate electrode 15 are exposed.

Next, as shown in FIG. 2(E), sputtering is performed in a nitrogen plasma ambient using a Ti target. Nitrogen-rich layers 12a and 13a are formed on the surface layer portion of the source/drain regions 12 and 13 and subsequently a $TiN_x$ layer 16 is formed over the whole surface of substrate containing the nitrogen-rich layers 12a and 13a and the gate electrode 15. At this time, the SiC substrate 11 is kept to a temperature in a range of 200° to 400° C. If the substrate temperature is low, a desired $TiN_x$ layer 16 cannot be formed. Next, after a $WSi_x$ layer 17 is formed on the $TiN_x$ layer 16 as shown in FIG. 2(F), a photoresist layer 18 is formed on the $WSi_x$ layer 17 with a predetermined pattern as shown in FIG. 2(G). As shown in FIG. 2(H), only the $WSi_x$ layer 17 is selectively etched by an etchant of a hydrofluoric and nitric acid group to expose the $TiN_x$ layer 16 partially. Finally, the remained $WSi_x$ layer 17 is masked and then the exposed $TiN_x$ layer 16 is partially removed by an etching using an etchant of a hydrogenperoxide and sulfuric acid group or a dry etching method using fluoride gas. As a result, the silicon carbide semiconductor device 10 shown in FIGS. 2(I) and 1 can be obtained.

In FIG. 1, a reference numeral 16a denotes a source electrode composed of $TiN_x$, 16b denotes a drain region composed of $TiN_x$, and 16c denote the $TiN_x$ layer. An interconnection 17a composed of $WSi_x$ is provided on the source electrode 16a, an interconnection 17b composed of $Wsi_x$ is provided on the drain region 16b, and an interconnection 17c composed of $WSi_x$ is provided on the gate electrode 15 via the $TiN_x$ layer 16c.

Following to the process shown in FIG. 2, an aluminium electrode (not shown) is formed on the P-type SiC substrate 11 to fix the potential of the SiC substrate 11. In order to ensure a ohmic contact between the P-type SiC substrate 11 and the aluminium electrode, thermal treatment is performed at a high temperature of about 900° C. The $TiN_x$ layer 18c functions as a barrier metal for suppressing reaction between the gate electrode 15 composed of Mo and the interconnection 17c.

The nitrogen-rich layers 12a and 13a on the surface layer portions of the source/drain regions 12 and 13 are formed by doping nitrogen in a plasma state. Compared to source/drain regions which is formed by an ion implantation method, the nitrogen-rich layers 12a and 13a are formed in a shallower surface layer region, that is, a region having a depth less than 500 Å from the surface. This plasma-assist nitrogen doping allows nitrogen to be doped with a high density only in the shallower surface layer region. Note that it is impossible to dope nitrogen with a high density only in the shallow surface layer region in a case of employing ion implantation of nitrogen in place of the plasma-asist nitrogen doping. For this reason, good contact characteristic can be obtained without changing a sheet resistivity of the source/drain region in accordance with the plasma-assist nitrogen doping.

<EMBODIMENT 2>

In order to form the source electrode 16a and drain electrode 16b composed of $TiN_x$ in the source region 12 and drain region 13 of the SiC substrate 11 of the first embodiment, respectively, a high frequency (RF) sputtering is performed under the following conditions. At this time, the source region 12 and drain region 13 have a nitrogen density of 2 to $8 \times 10^{18} / cm^3$, respectively.

| | |
|---|---|
| target | Ti |
| SiC substrate bias | none |
| SiC substrate temperature | 300° C. |
| RF power | 400 W |
| partial pressure of nitrogen | 0.5 Pa |
| $TiN_x$ layer | 1000 Å |

<EMBODIMENT 3>

The RF sputtering is performed to form an electrode composed of $TiN_x$ in the source region and drain region under the same conditions as embodiment 2 except that the partial pressure of nitrogen is changed to 2.0 Pa.

After $TiN_x$ layer of 1000 Å in thick is formed on the SiC substrate, a $WSi_x$ layer is formed with the thickness of 5000 Å on the $TiN_x$ layer to measure a contact resistivity on the samples of the embodiments 2 and 3. The $WSi_x$ layer is a protection film for preventing the $TiN_x$ layer from being damaged by probes in measuring the contact resistivity. After the $WSi_x$ layer is formed, electrodes are formed in a predetermined manner and then heat treatment is performed in an argon ambient for one hour at 400° C. The contact resistivities of two samples after the heat treatment are measured at a room temperature by four-terminal cross bridge Kelvin method. The measuring result is shown in a table 1.

TABLE 1

| | Partial pressure of nitrogen | Contact resistivity |
|---|---|---|
| EMBODIMENT 2 | 0.5 Pa | $8.9 \times 10^{-5} \Omega \cdot cm^2$ |
| EMBODIMENT 3 | 2.0 Pa | $5.5 \times 10^{-5} \Omega \cdot cm^2$ |

Figure 3:
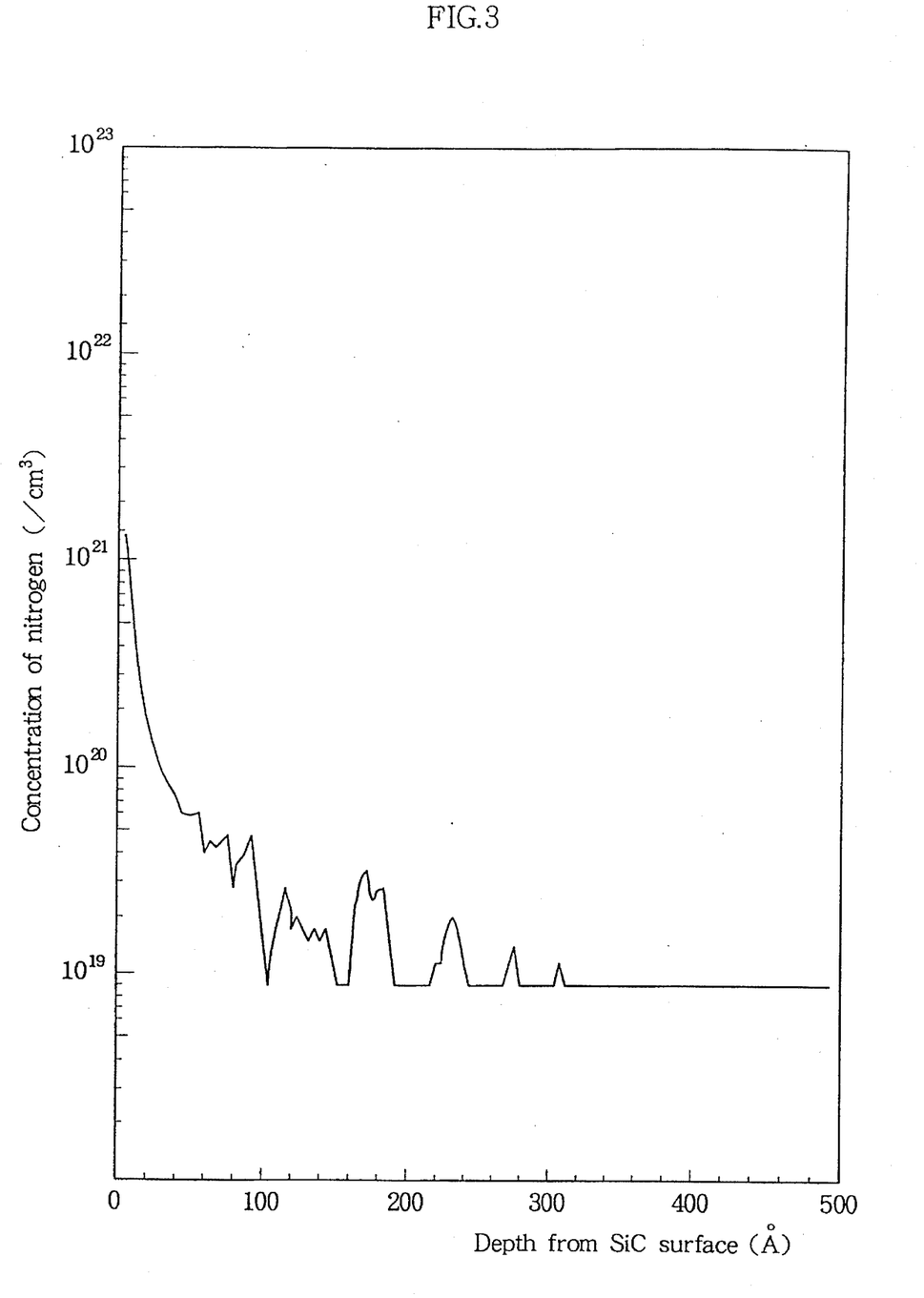
FIG. 3 is diagram showing a distribution of nitrogen concentration in the surface layer portion of the silicon carbide region according to a second embodiment of the present invention.
Figure 4:
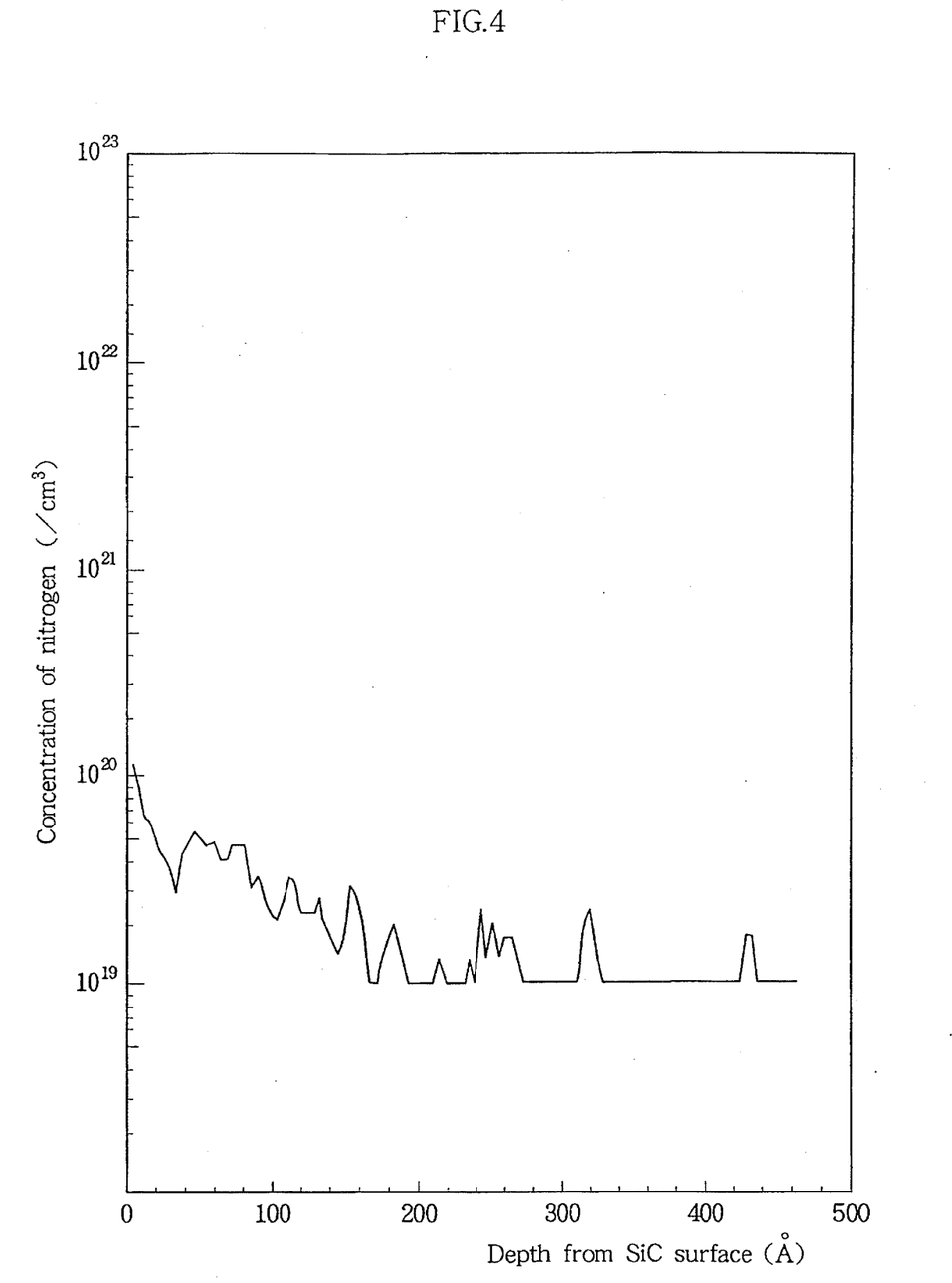
FIG. 4 is diagram showing a distribution of nitrogen concentration in the surface layer portion of the silicon carbide region according to a third embodiment of the present invention.
Figure 5:
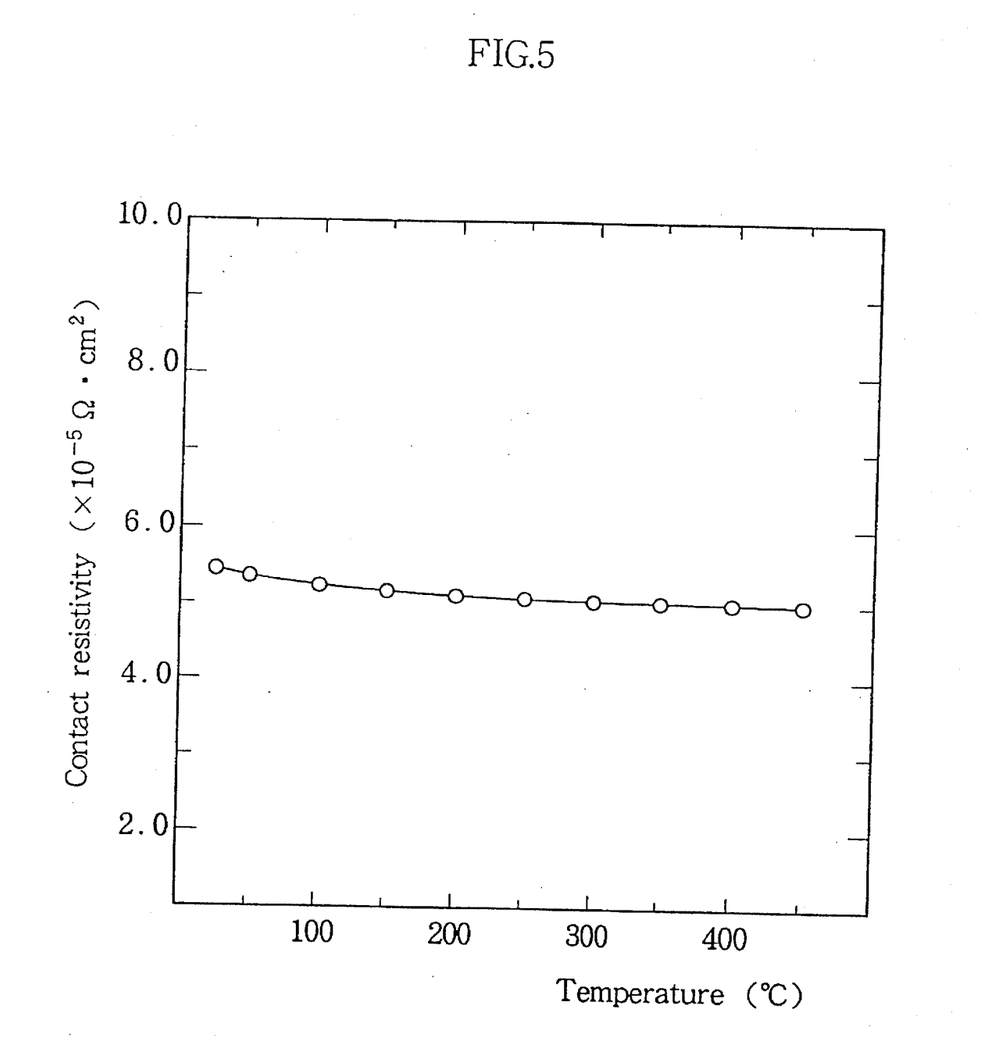
FIG. 5 is a diagram showing the dependency of the contact resistivity of electrode composed of $TiN_x$ upon temperature according to the third embodiment of the present invention.

On the other hand, a concentration distribution of nitrogen was measured from the SiC surface to the SiC inside by a secondary ion mass spectroscopy (SIMS) by rinsing the SiC substrates of the embodiments 2 and 3 by an etchant of hydrogen-peroxide and sulfuric acid group immediately after the $TiN_x$ film is formed under the above conditions to remove the $TiN_x$ film. The measuring results are shown in FIGS. 3 and 4. The sample of the embodiment 3 was sequentially heated up from a room temperature (25° C.), to 50° C., 100° C., 150° C., 200° C., 250° C., 300° C., 350° C., 400° C. and 450° C. and the contact resistivity was measured at respective temperatures. The measuring results are shown in FIG. 5.

As seen from the table 1, the contact resistivity of the embodiments 2 and 3 is smaller by one order compared to the conventional contact resistivity ($10^{-4}$ ohm.$cm^2$). Also, as seen from FIGS. 3 and 4, nitrogen was introduced with a high concentration of $2 \times 10^{19}$ /$cm^3$ from the SiC surface to a depth of 200 Å in the samples of both of the embodiments 2 and 3. Particularly, in the depth of 5 Å from the SiC surface, nitrogen was introduced to a high concentration of $1 \times 10^{21}$/$cm^3$ in the samples of the embodiment 2, and a high concentration of $1 \times 10^{20}$/$cm^3$ in the samples of the embodiment 3. Further, as seen from FIG. 5, even when an electrode composed of $TiN_x$ is heated up from the room temperature to the temperature of 450° C., the contact resistivity only changed slightly from $5.5 \times 10^{-5}$ ohm.$cm^2$ to $5 \times 10^{-5}$ ohm.$cm^2$. Note that the change in the contact resistivity is reversible with respect to the temperature.

<EMBODIMENT 4>

FIG. 6 shows a SiC bipolar transistor and the producing method according to a fourth embodiment of the present invention. In the embodiment, the $TiN_x$ layer is also formed between the interconnection and the electrode, in the same manner as in the first embodiment. Further, $TiN_x$ is used as the material of an electrode for the N-type SiC substrate (to be referred to as "N-SiC" hereinafter). The formation of $TiN_x$ layer is performed as in the first embodiment. In addition, $WSi_x$ is used for the interconnection on the $TiN_x$ layer.

Figure 6A:
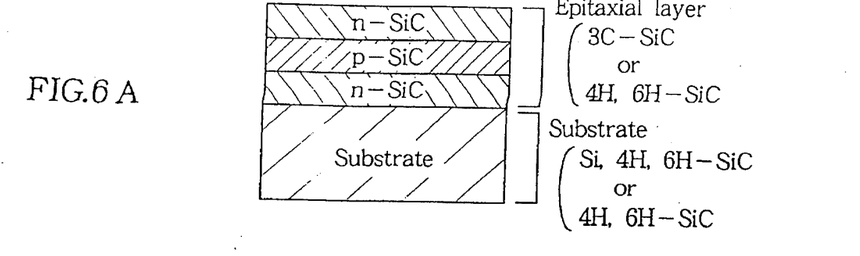
FIG. 6 is a cross section for explaining the producing method of a SiC bipolar transistor according to a fourth embodiment of the present invention.
Figure 6B:
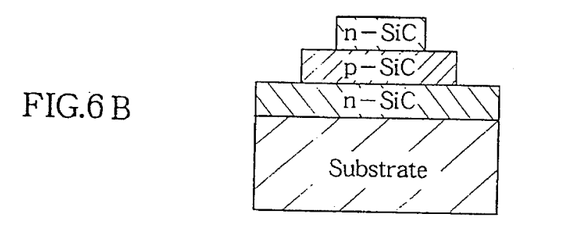
Figure 6C:
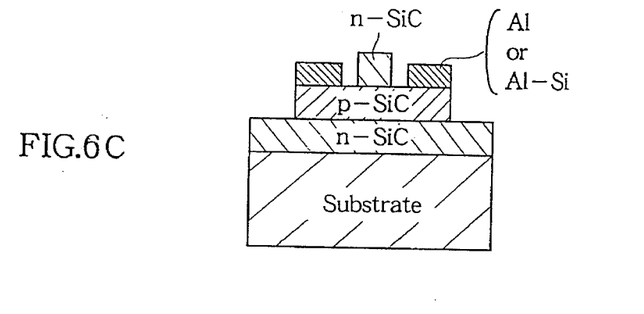
Figure 6D:
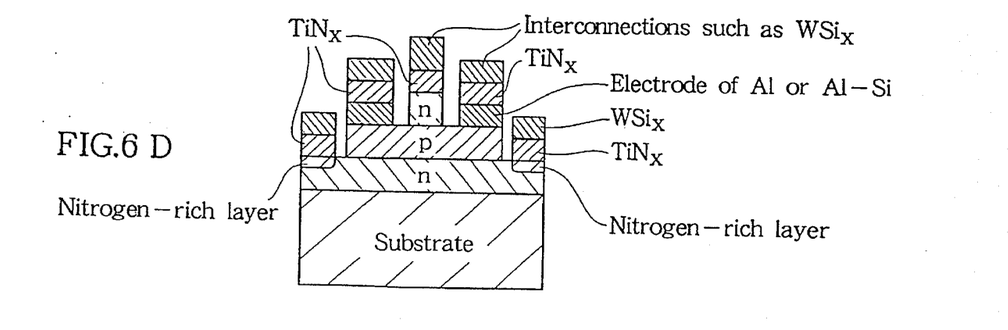

As shown in FIG. 6(A), the SiC bipolar transistor is formed by executing hetero-epitaxial growth of a 3C-SiC (β-SiC) layer on either of a Si substrate, 4H-SiC (α-SiC) layer or 6H-SiC (α-SiC) layer. The SiC bipolar transistor may be formed by executing homo-epitaxial growth of a 4H-SiC or 6H-SiC layer on either of a 4H-SiC or 6H-SiC layer. More particularly, N-SiC, P-SiC and N-SiC layers are grown on the substrate in that order. Then, as shown in FIG. 6(B), a part of each of the N-SiC and P-SiC layers is dry etched using a fluoride gas to expose a part of the surface of the P-SiC and N-SiC layer formed on the P-SiC substrate. Further, as shown in FIG. 6(C), an electrode of Al or material containing Al such as Al-Si is formed on the P-SiC layer. Subsequently, heat treatment is executed at a high temperature of 900° C. or above. Here, as shown in FIG. 6(D), a $TiN_x$ layer is formed in the same process as in the first embodiment. After the etching, the interconnection of a material such as $WSi_x$ is formed on the $TiN_x$ layer. Note that a $WSi_x$ layer may be successively formed on the $TiN_x$ layer to etch these layers at the same time.

<EMBODIMENT 5>

FIG. 7 is shows a method of producing a silicon carbide semiconductor device 20 of a MESFET type according to a fifth embodiment of the present invention. As shown in FIG. 7 (A), a gate electrode 25 of Au, Pt or Al is formed directly on the same N-type SiC substrate 21 as in the first embodiment by vapor deposition method or a sputtering method. As shown in FIG. 7(B), the silicon carbide substrate 21 on the both sides of the gate electrode 25 is provided with N-type source region 22 and drain region 23. Sputtering is carried out in a nitrogen plasma ambient using Ti as a target, as in the first embodiment so that a source electrode 26a, drain region 26B, and $TiN_x$ layer 26c composed of $TiN_x$ are formed on the source/drain regions 22 and 23 and the gate electrode 25, respectively. At this time, nitrogen-rich layers 22a and 23a are formed in the surface layer portions of the source/drain regions 22 and 23 which are in contact with the electrodes 26a and 26b, respectively. $TiN_x$ is used as an electrode material of an ohmic contact to the SiC substrate even in this embodiment.

<EMBODIMENT 6>

Figure 8:
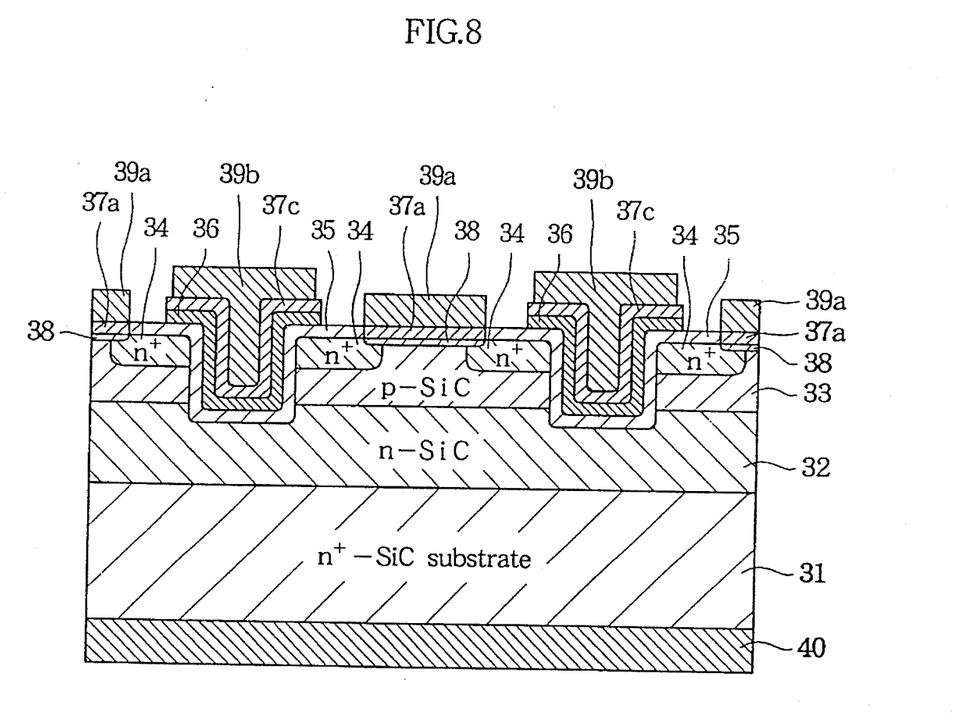
FIG. 8 is a cross section showing a vertical type MOS transistor according to a sixth embodiment of the present invention.

FIG. 8 shows an sixth embodiment of the present invention in which the present invention is applied to a so-called vertical type MOS transistor. The TiN$_x$ layer is formed for the gate electrode and a source region. The vertical type of MOS transistor is manufactured in the following manner. First, an N-SiC layer 32 and a P-SiC layer 33 are formed on an N$^+$-SiC substrate 31 in that order by an epitaxial growth method. Next, after ion implantation of nitrogen is carried out to the SiC layer 33 to form an N$^+$-SiC layer 34, an annealing process is carried out to cure the damage due to the ion implantation, Next, after making a U-liked shape to the SiC layer by an reactive ion etching (RIE) method, an insulating film 35 is formed of SiO$_2$. Subsequently, after a gate electrode 36 is formed in the U-liked shape portion, a contact hole is formed on the source region. Then, source electrode layer 37a composed of TiN$_x$ and the TiN$_x$ layer 37c are formed on the source region and the gate electrode 36 in the same manner as in the first embodiment, respectively. At this time, a nitrogen-rich layer 38 is formed in the surface layer portion of the source region which the source electrode layer 37a contacts. Subsequently, interconnections 39a and 39b composed of WSi$_x$ are formed on the source electrode layer 37a and the TiN$_x$ layer 37c. Finally, a drain region 40 is formed on the rear surface of the SiC substrate 31.

Note that although TiN$_x$ is used as a metal nitride in the first to sixth embodiments, other metal nitride such as ZrN, HfN, VN and TaN may be used in the first to sixth embodiments in place of TiN$_x$.

As described above, according to the present invention, source/drain electrode material having a small contact resistivity can be obtained. Also, a gate electrode of SiC semiconductor device can be formed without detects such as peeling, irregurality and holes. Further, a method of producing such a practicable SiC semiconductor device can be provided.

What is claimed is:

1. A method of producing a silicon carbide semiconductor device, comprising the steps of:

forming N-type source/drain SiC regions (12, 13) on a P-type silicon carbide substrate (11);

forming an insulating film (14a) on said silicon carbide substrate (11) between said source/drain SiC regions (12, 13);

forming a gate electrode (15) on said insulating film (14a);

forming on said gate electrode (15) and said source/drain SiC regions (12, 13) metal nitride layers (16c, 16a, 16b) composed of either one of TiN, ZrN, HfN, VN and TaN; and forming interconnections (17c, 17a, 17b) on said metal nitride layers (16c, 16a, 16b).

2. A method of producing a silicon carbide semiconductor device according to claim 1, wherein said forming a metal nitride layer includes forming nitrogen-rich layers (12a, 13a) in the surface layer portion of said source/drain SiC regions (12, 13) when said metal nitride layers (16a, 16b) are formed.

3. A method of producing a silicon carbide semiconductor device according to claim 1, wherein said forming a metal nitride layer includes forming said metal nitride layers (16c, 16a, 16b) in a nitrogen ambient by a sputtering method using a metal target composed of either one of Ti, Zr, Hf, V and Ta or a metal nitride target composed of either one of TiN, ZrN, HfN, VN and TaN.

* * * * *